United States Patent [19]

Noy

[11] Patent Number: 4,913,662

[45] Date of Patent: Apr. 3, 1990

[54] FLAT, FLEXIBLE, CABLE CONSTRUCTION AND CONNECTOR ATTACHED THERETO

[76] Inventor: Nadin Noy, 29 Tchernihovski Street, Tel Aviv, Israel

[21] Appl. No.: 319,191

[22] Filed: Mar. 6, 1989

[51] Int. Cl.$^4$ .......................... H05K 1/14; H01B 7/08
[52] U.S. Cl. .............................. 439/498; 174/117 FF; 174/268; 439/495
[58] Field of Search ........... 174/74 R, 117 F, 117 FF, 174/117 PC; 439/492, 495, 498

[56] References Cited

U.S. PATENT DOCUMENTS

| | | | |
|---|---|---|---|
| 4,092,057 | 5/1978 | Walton | 174/117 FF X |
| 4,679,868 | 7/1987 | Hasircoglu | 439/495 |

FOREIGN PATENT DOCUMENTS 2130019  5/1984  United Kingdom ................. 439/492

*Primary Examiner*—Morris H. Nimmo
*Attorney, Agent, or Firm*—Benjamin J. Barish

[57] ABSTRACT

A flat, flexible cable construction comprises two flat, flexible insulating strips each including a plurality of electrical conductors extending along one side of one strip and the opposite side of the other strip, which electrical conductors are exposed at their ends on the inner contacting faces of the two insulating strips. Each of the insulating strips is formed with a transversely-extending slit starting from the edge of the side not including its respective electrical conductors and terminating short of the side including its respective electrical conductors, whereby the two ends of the insulating strips may be transposed by inserting the non-slitted side of one into the slitted side of the other to thereby transpose the outer exposed ends of the electrical conductors from the inner contacting faces of the insulating strips to the outer non-contacting faces of the insulating strips for connection to an electrical connector.

19 Claims, 1 Drawing Sheet

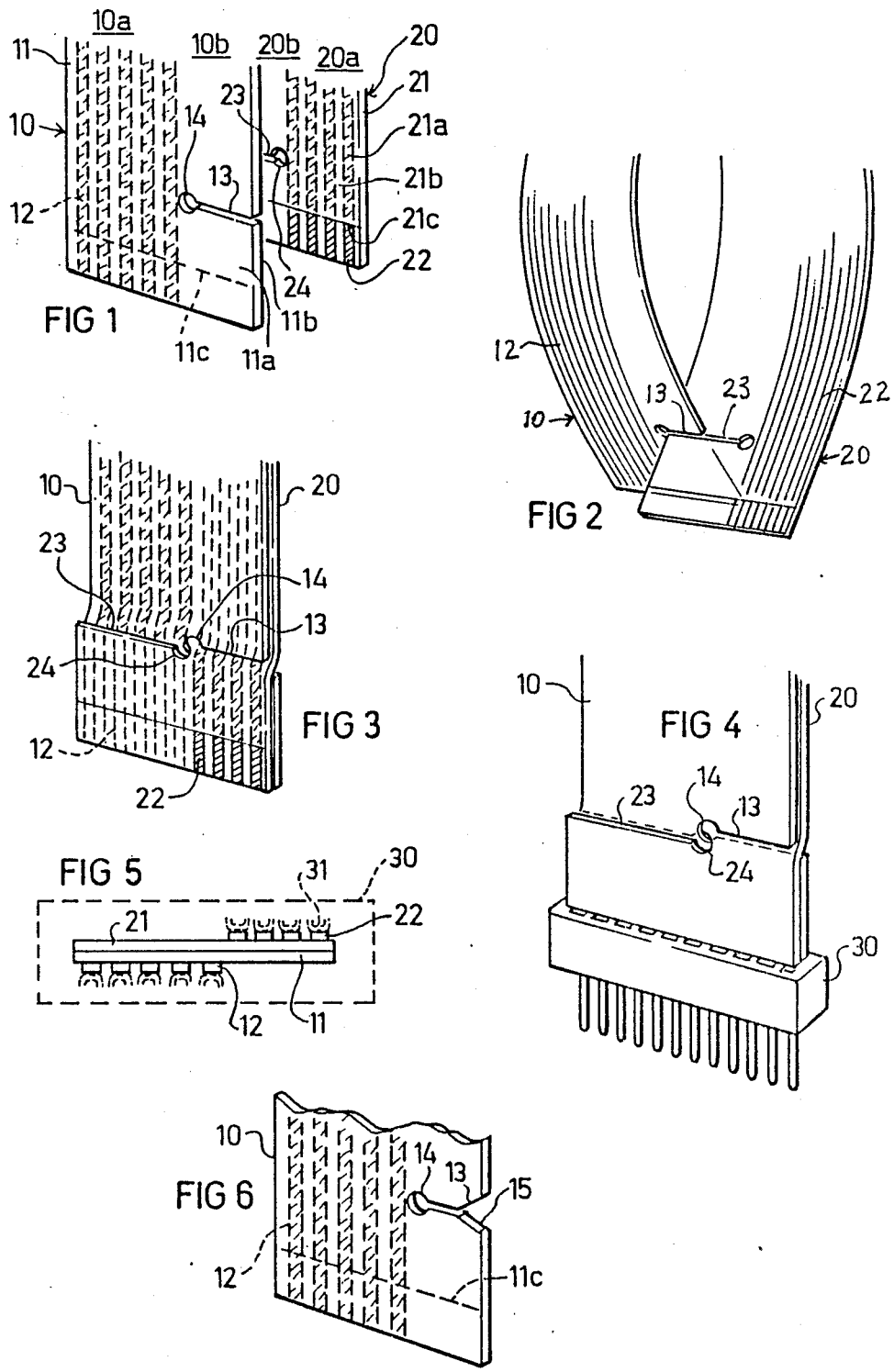

FLAT, FLEXIBLE, CABLE CONSTRUCTION AND CONNECTOR ATTACHED THERETO

BACKGROUND OF THE INVENTION

The present invention relates to flat, flexible, cable constructions, and particularly to such cable constructions to enable connectors to be attached.

Flat, flexible, cables are now widely used in various electrical devices, particularly those in which components are prepared by printed circuit techniques. The electrical device frequently includes two layers each containing electrically-conductive pathways to be connected together by a common connector. One example is a membrane switching assembly including two printed circuit sections to be connected together by a connector. In such applications, each printed circuit section is integrally formed with a flat flexible cable carrying a plurality of flat electrical conductors to be connected together by the connector.

In one known construction, the electrical conductors are covered by insulating material on the outer faces of the two flat electrical cables, but their ends are exposed on the inner faces for connection to the electrical connector. Such a construction utilizes a connector which pierces the outer insulating faces of the flat cables in order to make connections to the electrical conductors.

Another construction is known wherein the ends of the flat cables to be connected to the connector are formed with cut-outs so as to expose the conductor ends for connection to the connector. Such a construction enables "H-type" connectors, or other connectors having sliding conacts, to be used, instead of piercing contacts. This is an advantage since it enables such connectors to be conveniently applied and removed as desired, as compared to the piercing-type connectors which are usually intended only for one-time use. However, the latter cable construction enabling the use of sliding-contact type connectors present difficulties in the application of the connector to the end of the cable because the cut-outs formed at the ends produce a non-continuous edge, partly of single thickness and partly of double thickness.

BRIEF SUMMARY OF THE INVENTION

An object of the present invention is to provide a flat, flexible, cable construction which may be used with the H-type or slidable-contact type connectors but which avoid the above disadvantage.

According to the present invention, there is provided a flat, flexible, cable construction, comprising: a first falt, flexible insulating strip including at least one electrical conductor extending longitudinally along one side thereof; and a second flat, flexible insulating strip in overlying contact with the first insulating strip and including at least one electrical conductor extending longitudinally along the opposite side thereof. Each of the electrical conductors has exposed ends facing the inner contacting faces of the two insulating strips. Each of the insulating strips is formed with a transversely-extending slit spaced inwardly from the exposed end of its respective electrical conductor, starting from the edge of the side not including its respective electrical conductor and terminating short of the side including its respective electrical conductor.

The arrangement is such that the respective ends of the two insulating strips may be transposed with respect to each other by inserting the slitted side of one insulating strip into the slitted side of the other insulating strip so that the exposed ends of the electrical conductors facing each other on the inner contacting faces of the two strips are transposed from the inner faces to the outer faces of the two strips for connection to an electrical connector.

It will thus be seen that such a cable construction enables the use of the H-type or slidable-contact type connectors, but without the disadvantages mentioned above. Thus, the edges of the two cables receiving the connector are not formed with cut-outs, but rather form a continuous double-edge for receiving the connector, thereby facilitating the insertion of that end of the cable into the connector.

In the preferred embodiment of the invention described below, each of the electrical conductors is embedded in its respective insulating strip for the length of the conductor except for its exposed end; in addition, each of the insulating strips includes a plurality of electrical conductors extending in parallel spaced relationship longitudinally of the unslitted side of the insulating strip.

The invention also provides a cable construction as described above in combination with an electrical connector applied over the ends of the two insulating strips at the exposed ends of the electrical conductors and having contacts slidably engaging the exposed ends of the electrical conductors.

Further features and advantages of the invention will be apparent from the description below.

BRIEF DESCRIPTION OF THE DRAWINGS

The invention is herein described, by way of example only, with reference to the accompanying drawings, wherein:

FIG. 1 is a three-dimensional view illustrating one form of flat, flexible, cable construction in accordance with the present invention;

FIG. 2 illustrates the manner of transposing the ends of the two insulating strips before inserting them into the connector;

FIG. 3 illustrates the two flat cables of FIG. 1 after the transposition has been completed and before the connector is inserted;

FIG. 4 illustrates the connector applied to the transposed ends of the two flat cables;

FIG. 5 is an end view illustrating the transposed ends of the flat cables, and the electrical contacts of the connector in contact with the exposed ends of the electrical conductors; and FIG. 6 is a fragmentary view illustrating a modification in the construction of the flat cables to facilitate the transposition of their ends.

DESCRIPTION OF A PREFERRED EMBODIMENT

FIG. 1 illustrates two flat cables, generally designated 10 and 20, respectively. These may be integrally formed with two printed-circuit sections of an electrical device, such as a membrane switching assembly, to be electrically connected by a common connector, generally designated 30 in FIGS. 4 and 5.

Cable 10 includes a flexible strip 11 constituted of two layers 11a, 11b of flat, flexible, stiff sheet material laminated together with a plurality of flat electrical conductors 12 in between, so that the conductors are embedded within the insulating strip 11. Cable 20 is similarly constructed of a flat insulating strip 21 constituted of two layers 21a, 21b of flat, flexible, stiff sheet material laminated together with a plurality of electrical conductors 22 in between so as to be embedded within the insulating strip. However, as shown particularly with respect to cable 20, the inner layer (21b) of the insulating strip 21 terminates short of the end of the cable, as shown by line 21c in FIG. 1, so that the ends of the conductors 22 are exposed at the inner faces of the insulating strip for connection to the electrical connector. In a similar manner, the inner layer 11b of insulating strip 11 terminates short of the end of the cable along line 11c, so that the portion of the electrical conductors 12 at the end of cable 10 are also exposed at the inner face of the insulating strip.

It will be seen from FIG. 1 that the plurality of conductors 12 within insulating strip 11 extend longitudinally along one side of the insulating strip, so that they occupy only one side 10a of the flexible cable 10, leaving the opposite side 10b not occupied by the electrical conductors. In a similar manner, the electrical conductors 22 extend longitudinally along one side 20a of cable 20, the opposite side of the cable being free of the electrical conductors. It will also be seen that when the two cables are assembled together in overlying, co-extensive relationship, side 10a of cable 10 containing the electrical conductors 12 becomes aligned with side 20b of cable 20 not containing the electrical conductors 22; and similarly side 20a of cable 20 containing the electrical conductors 22 becomes aligned with side 10b of cable 10 not containing the electrical conductors 12.

Slightly inwardly from the end containing the exposed conductors 12, cable 10 is formed with a slot 13 starting from the edge at side 20b *l not containing the electrical conductors 12 and extending tranversely across its side up to side 10a* containing the electrical conductors 12. Slot 13 terminates in a circular opening 14 at the end of side 10b. In a similar manner, cable 20 is formed with a slot 23 also starting from the edge of its side 20b not containing the electrical conductors 22 and extending transversely across its side, and terminating in a circular opening 24 at the end of the side and just before reaching side 20a containing the electrical conductors 22.

It will thus be seen that when the two flat cables 10 and 20 are in their normal overlying relationship as shown in FIG. 1, the conductors 12 and 22 are exposed on the inner contacting faces of the two cables. Since the outer insulating layers 10a, 21a of the two flexible cables 10, 20 cover the electrical conductors 12,22, such conductors may be contacted by the contacts of an electrical connector only if the electrical connector also pierces the outer insulating layers 10a, 21a of the two flexible cables. However, the slits 13, 23 in the two cables 10, 20 permit the ends of the two cables to be transposed, so as to move the exposed ends of the conductors 12 and 22 to the outer faces of the cables for connection to the electrical connector.

This transposition of the exposed ends of the electrical conductors 12 and 22 is more particularly illustrated in FIGS. 2 and 3. Thus, to effect this transposition, the slitted side 10b of cable 10 is inserted into the slitted side 20b of cable 20, as shown in FIG. 2, whereby the slitted side 10b not carrying the electrical conductors 12 of cable 10 becomes aligned with the unslitted side 20a of cable 20 containing the electrical conductors 22. At the same time, the exposed ends of electrical conductors 12 are transposed so as to be disposed on the outer faces of the two cables 10 and 11, as shown particularly in FIG. 5. This enables them to be engaged by the slidable contacts 31 of the connector 30 when the connector is applied to the ends of the two cables.

It will be seen that when the exposed ends of the electrical conductors 12, 22 in the two cables 10 and 20 are in their transposed positions as illustrated in FIG. 5, the respective ends of the two cables form a continuous, double-layer edge. This stiffens the ends of the two cables and facilitates their introduction into connector 30. Accordingly, connector 30 may be quickly and conveniently applied, removed and reapplied to the ends of the two cables.

The circular openings 14 and 24 at the ends of the transverse slits 13 and 23 in the two cables 10 and 20 aid in the bending of the respective ends of the two cables to facilitate the insertion of the slitted sides of the two cables during the transposition process, as illustrated in FIGS. 2 and 3. To further facilitate the insertion of the slitted sides of the two cables, each slit may be formed with a mouth having inwardly tapered sides, as shown at 15 in FIG. 6.

While the invention has been described with respect to one preferred embodiment, it will be appreciated that many other variations, modifications and applications of the invention may be made.

What is claimed is:

1. A flat, flexible, cable construction, comprising:
   a first flat, flexible, insulating strip including at least one electrical conductor extending longitudinally along one side thereof;
   a second flat, flexible, insulating strip in overlying contact with said first insulating strip and including at least one electrical conductor extending longitudinally along the opposite side thereof;
   each of said electrical conductors having exposed ends facing the inner contacting faces of the two insulating strips;
   each of said insulating strips being formed with a transversely-extending slit spaced inwardly from the exposed end of its respective electrical conductor, starting from the edge of the side not including its respective electrical conductor and terminating short of the side including its respective electrical conductor;
   whereby the respective ends of the two insulating strips may be transposed with respect to each other by inserting the slitted side of one insulating strip into the slitted side of the other insulating strip so that the exposed ends of the electrical conductors facing each other on the inner contacting faces of the two strips are transposed from the inner faces to the outer faces of the two strips for connection to an electrical connector.

2. The cable construction according to claim 1, wherein each of said electrical conductors is embedded in its respective insulating strip for the length of the electrical conductor except at its exposed end.

3. The cable construction according to claim 1, wherein each of said insulating strips includes a plurality of electrical conductors extending in parallel spaced relationship longitudinally of its unslitted side.

4. The cable construction according to claim 3, wherein there are at least four electrical conductors in each of said insulating strips extending longitudinally of the unslitted side thereof.

5. The cable construction according to claim 1, wherein each of said insulating strips includes two layers of a flat, flexible, stiff sheet material laminated together with at least one flat electrical conductor in between the layers, one of said layers of sheet material terminating short of the end of the strip to expose the respective end of the electrical conductor.

6. The cable construction according to claim 1, wherein each of said transversely-extending slits terminates in a circular opening at its inner end short of the side including its respective electrical conductor.

7. The cable construction according to claim 1, wherein each of said transversely-extending slits is formed with a mouth having inwardly tapered sides.

8. The cable construction according to claim 1, in combination with an electrical connector applied over the ends of the two insulating strips at the exposed ends of the electrical conductors and having contacts slidably engaging the exposed ends of the electrical conductors.

9. A flat, flexible, cable construction, comprising:
a first flat, flexible, insulating strip including a plurality of electrical conductors extending longitudinally thereof along one side of the electrical strip;
a second flat, flexible, insulating strip in overlying contact with said first insulating strip and including a plurality of electrical conductors extending in parallel spaced relationship longitudinally along the opposite side of the insulating strip;
each of said electrical conductors being embedded in the respective insulating strips except for their ends on the inner contacting faces of the two insulating strips so as to expose the electrical conductors at such ends;
each of said insulating strips being formed with a transversly-extending slit spaced inwardly from the exposed end of its respective electrical conductor, starting from the edge of the side not including its respective electrical conductors and terminating short of the side including its respective electrical conductors.

10. The cable construction according to claim 9, wherein each of said insulating strips includes two layers of flat, flexible sheet material laminated together with its plurality of electrical conductors in between, one of said layers of sheet material terminating short of one side of the strip to expose the respective ends of the electrical conductors.

11. The cable construction according to claim 10, wherein said layers of each of the insulating strips are of flat, flexible, stiff sheet material, and said electrical conductors laminated in between are flat, electrically-conductive foils.

12. The cable construction according to claim 9, wherein each of said transversely-extending slits terminates in a circular opening at its inner end short of the side of the insulating strip including its respective electrical conductors.

13. The cable construction according to claim 9, wherein each slit is formed with a mouth having inwardly tapered sides.

14. The cable construction according to claim 9, wherein there are at least four electrical conductors in each of said insulating strips extending longitudinally of the unslitted side in its respective insulating strip.

15. The cable construction according to claim 9, in combination with an electrical connector applied over the ends of the insulating strips at the exposed ends of the electrical conductors and having contacts slidably engaging the exposed ends of the electrical conductors.

16. A flat, flexible, cable construction, comprising:
a first flat, flexible, insulating strip including a plurality of electrical conductors extending in parallel spaced relationship extending longitudinally along one side of the insulating strip;
a second, flat, flexible, insulating strip in overlying contact with said first insulating strip and including a plurality of electrical conductors extending longitudinally in parallel spaced relationship along the opposite side of the insulating strip;
each of said insulating strips including two layers of flat, flexible, sheet material laminated together with the respective electrical conductors in between, one of said layers of each insulating strip terminating short of the end of the strip to expose the respective ends of the electrical conductors;
each of said insulating strips being formed with a transversely-extending slit spaced inwardly from the exposed end of its respective electrical conductor, starting from the edge of the side not including its respective electrical conductors and terminating short of the side including its respective electrical conductors;
each of said slits terminating in a circular opening at its inner end short of the side including its respective electrical conductors.

17. The cable construction according to claim 16, wherein all said electrical conductors between the laminated layers of sheet material in its respective insulating strip are flat, electrically-conductive foils.

18. The cable construction according to claim 16, wherein each slit is formed with a mouth having inwardly tapered sides.

19. The cable construction according to claim 16, in combination with an electrical connector applied over the ends of the two insulating strips at the exposed ends of their electrical conductors and having contacts slidably engaging the exposed ends of the electrical conductors.

* * * * *